United States Patent
Deval et al.

(10) Patent No.: US 7,253,687 B2
(45) Date of Patent: Aug. 7, 2007

(54) CLAMPING CIRCUIT FOR OPERATIONAL AMPLIFIERS

(75) Inventors: Philippe Deval, Lutry (CH); Christian Albrecht, Echandens (CH)

(73) Assignee: Microchip Technology Incorporated, Chandler, AZ (US)

( * ) Notice: Subject to any disclaimer, the term of this patent is extended or adjusted under 35 U.S.C. 154(b) by 141 days.

(21) Appl. No.: 11/181,231

(22) Filed: Jul. 14, 2005

(65) Prior Publication Data
US 2006/0017504 A1    Jan. 26, 2006

Related U.S. Application Data

(60) Provisional application No. 60/590,501, filed on Jul. 23, 2004.

(51) Int. Cl.
  *H03F 1/52* (2006.01)
(52) U.S. Cl. .................................................. 330/298
(58) Field of Classification Search ........ 330/259–260, 330/298
See application file for complete search history.

(56) References Cited

U.S. PATENT DOCUMENTS 5,307,024 A * 4/1994 Metz et al. ................ 330/259

OTHER PUBLICATIONS

Säckinger, E. et al.; "A Versatile Building Block: The CMOS Differential Difference Amplifier"; IEEE Journal of Solid-State Circuits, vol. SC-22, No. 2, Apr. 1987.

* cited by examiner

*Primary Examiner*—Robert Pascal
*Assistant Examiner*—Hieu Nguyen
(74) *Attorney, Agent, or Firm*—Baker Botts L.L.P.

(57) ABSTRACT

A differential input operational amplifier has a voltage clamp differential transistor pair coupled to an input differential transistor pair of the operational amplifier. The voltage clamp differential transistor pair limits the output voltage of the operational amplifier by taking over control of the operational amplifier circuits from the input differential transistor pair as the output voltage approaches a clamp voltage value. A reference voltage may be used to set the output voltage at which the input differential transistor pair will be clamped by the voltage clamp differential transistor pair. Below the clamp voltage, operation of the input differential transistor pair will not be affected. At the clamp voltage the input differential transistor pair will no longer control the output of the differential amplifier, rather the voltage clamp differential transistor pair will control the maximum voltage output of the differential amplifier. Both positive and negative limiting of the operational amplifier output voltage may be accomplished.

19 Claims, 2 Drawing Sheets

CLAMPING CIRCUIT FOR OPERATIONAL AMPLIFIERS

RELATED PATENT APPLICATION

This application claims priority to commonly owned U.S. Provisional Patent Application Ser. No. 60/590,501; filed Jul. 23, 2004; entitled "Clamping Circuit for Operational Amplifiers," by Philippe Deval and Christian Albrecht; which is hereby incorporated by reference herein for all purposes.

TECHNICAL FIELD

The present disclosure relates to an electronic operational amplifier, more particularly, to a clamping circuit to limit the output of the operational amplifier.

BACKGROUND OF THE RELATED TECHNOLOGY

In switch mode power supplies, the maximum output current is directly dependent upon the maximum output swing of the error amplifier of an operational amplifier. The required maximum output swing of the error amplifier is different from the power supply of the system or from the maximum output swing of the operational amplifier and it is difficult to obtain good precision within the operational amplifier. Several techniques have been used to limit the output swing, e.g., components such as Zener diodes may be placed in the output amplifier to clamp the output signal swing. Regulation of the power supply of the amplifier may be used to guarantee a maximum output voltage. In some cases, these applications dissipate a lot of power. Clamping with Zener diodes in the control loop has also been used to limit the output voltage of an operational amplifier.

However, what is needed is a way to minimize power dissipation (energy consumption) when controlling an output swing of an operational amplifier so as not to exceed a reference value.

SUMMARY OF THE INVENTION

According to specific example embodiments described in the present disclosure, an operational amplifier having output voltage limitation comprises an operational amplifier having a differential input and an output. The differential input comprises a differentially connected transistor pair. A voltage clamp comprises a differentially connected transistor pair, wherein one transistor of the voltage clamp transistor pair is coupled to the differential input transistor pair and the output, and the other transistor of the voltage clamp transistor pair is coupled to a clamp voltage reference, such that when a voltage on the output of the operational amplifier is substantially equal to the clamp voltage reference the voltage clamp controls the output voltage of the operational amplifier.

The input differential transistor pair of the operational amplifier is controlled so as to limit the output thereof. A reference voltage may be used to set a clamp voltage value at the output of the operational amplifier at which the operational amplifier input differential transistor pair will be clamped. Below the clamp voltage, operation of the input differential transistor pair will not be affected. At the clamp voltage the input differential transistor pair will no longer control the output of the differential amplifier, rather the voltage clamp differential transistor pair will control the maximum output of the differential amplifier. Both positive and negative limiting of the operational amplifier output may be accomplished, according to the teaching of the present disclosure. Specific example embodiments described in the present disclosure may comprise two or more differential (transistor) pairs, connected in parallel, as input stages of an operational amplifier. The biasing of these two differential transistor pairs may be such that only one transistor pair is operational at a time, the other differential transistor pair being saturated or overdriven by the active differential transistor pair.

The operational amplifier has minimal power dissipation (energy consumption) when the output swing is limited in accordance with a reference, e.g., a voltage reference, by controlling a differentially connected transistor pair of a differential input amplifier circuit of the operational amplifier. The differential input of the operational amplifier is controlled so as to limit the output of the operational amplifier. The reference may be used in determining the limit of the output swing. The operational amplifier output is thereby limited without hard clamping of the output or modification of the feedback network impedance, thus saving power. Embodiments according to the present disclosure may be advantageously used, for example, in switch mode power supply DC-DC converters. Both positive and negative output swings may be limited according to the specific example embodiments described in the present disclosure.

During normal operation (out of the clamping area) the differential transistor pair limiting the output of the operational amplifier is inactive and only the main transistor pair is working. When the output of the operational amplifier reaches the clamp voltage (e.g., reference voltage), the voltage clamp differential transistor pair controls by becoming active and overdrives the main transistor pair (active for normal operation below the clamp voltage output). The output of an operational amplifier is typically current, however, when driving a resistive and/or reactive load, the current output from the operational amplifier becomes a voltage output, VOUT. Thus by comparing VOUT to the reference voltage, the output of the operational amplifier may be restricted without an increase in power being drawn by the operational amplifier.

An advantage according to the present disclosure is that the output swing limiting circuit may be implemented with an independent semiconductor fabrication process. Another advantage is minimizing power consumption of the operational amplifier. Still another advantage is substantially no delay or overshoot during recovery from a rapid input signal change. Yet another advantage is symmetrical or asymmetrical voltage clamping.

Other features and advantages according to the present disclosure will be apparent from the following description of specific example embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings wherein.

Figure 1:
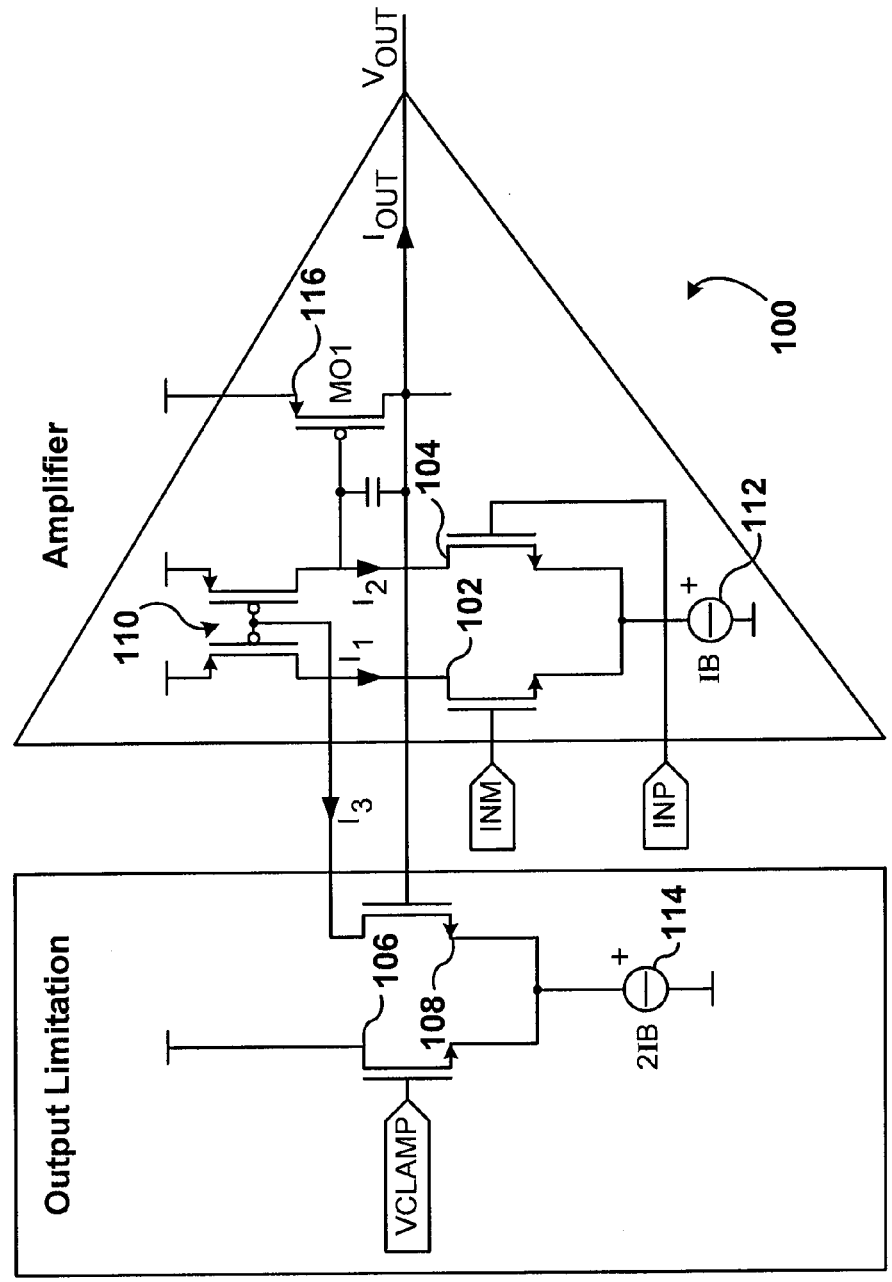
FIG. 1 is a schematic diagram of an operational amplifier having an input clamping circuit that limits the output of the operational amplifier, according to a specific example embodiment of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION OF SPECIFIC EMBODIMENTS

Referring now to the drawings, the details of specific embodiments of the present invention are schematically illustrated. Like elements in the drawings will be represented by like numbers, and similar elements will be represented by like numbers with a different lower case letter suffix.

Referring to FIG. 1, depicted is a schematic diagram of an operational amplifier having an input clamping circuit that limits the output of the operational amplifier, according to a specific example embodiment of the present disclosure. The operational amplifier, generally represented by the numeral 100, may have its output substantially clamped so as not to exceed a clamp voltage reference, VCLAMP. Transistors 102 and 104 comprise the main differential input pair of the operational amplifier 100, and transistors 106 and 108 comprise the differential pair that cause the output of the operational amplifier not to exceed (clamped) VCLAMP. The transistors 102 and 104 are coupled to a current mirror 110 and a current source 112 having a current source value of IB. According to operation of the circuit shown in FIG. 1, $I_1$ and $I_2$ are equal to IB/2 when the transistor 108 is off, e.g., no $I_3$ current being drawn by the transistor 108. The transistors 106 and 108 are coupled to a current source 114.

During normal operation (VOUT≦VCLAMP), the transistor 108 of the clamping pair (transistors 106 and 108) is off and current of 2 IB from the current source 114 flows through the transistor 106. Therefore the clamping pair, transistors 106 and 108, have substantially no effect on the behavior of the operational amplifier, e.g., the main differential input pair transistors 102 and 104 control the output transistor 116 of operational amplifier 100 which thereby operates as a regular operational amplifier.

When the output voltage, VOUT, approaches VCLAMP, transistor 108 of the clamping differential pair (transistors 106 and 108) starts to conduct (drawing current $I_3$) and takes over a portion of the control of the operational amplifier 100. When the output voltage, VOUT, is substantially equal to VCLAMP, the current, $I_3$, through transistor 108 is equal to IB. At this point the current flowing in the transistor 108 is equal to the current flowing in the main differential pair, transistors 102 and 104, and therefore transistor 108 takes over substantially full control of the output voltage, VOUT, which is thereby limited (clamped) to VCLAMP. In a similar fashion, the output of the operational amplifier may be clamped to a negative voltage, e.g., V(−)CLAMP.

In some operational amplifier applications such a simple scheme may not be applicable, but the principle of overdriving the error current of the main differential pair by the current coming out of a stronger differential pair may be used. This is valid also for a rail-to-rail input operational amplifier using complementary input differential pairs as described more fully in the specific exemplary embodiment depicted in FIG. 2.

Figure 2:
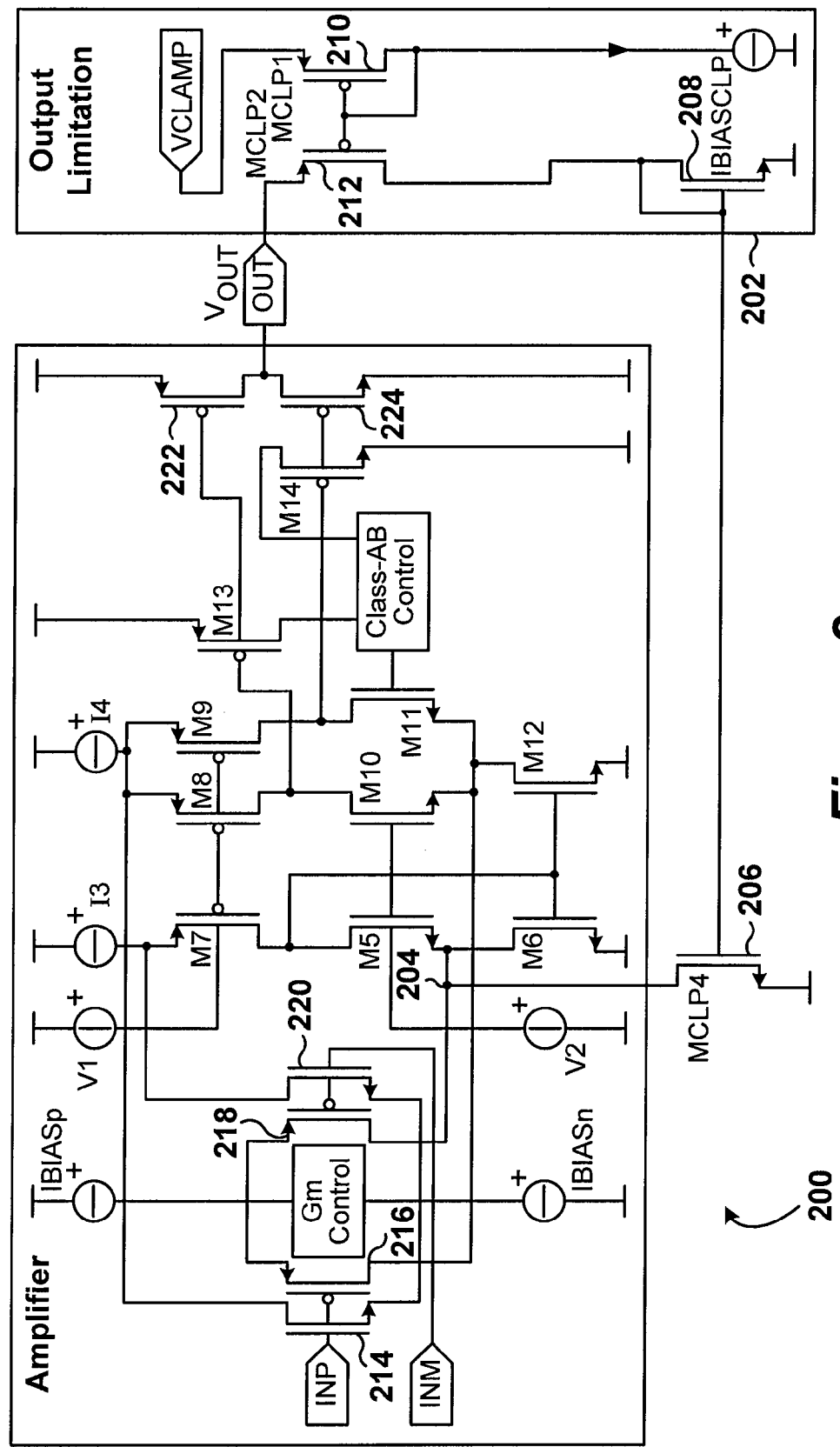
FIG. 2 is a schematic diagram of an operational amplifier application having its output limited, according to another specific example embodiment of the present disclosure.

Referring now to FIG. 2, depicted is a schematic diagram of an operational amplifier having its output limited, according to another specific example embodiment of the present disclosure. The operational amplifier, generally represented by the numeral 200, has differential inputs comprising transistors 214, 216, 218 and 220. A single ended output comprises CMOS transistors 222 and 224. The other circuitry between the differential inputs and the output may be any appropriate circuitry know to those of ordinary skill in the art of integrated circuit operational amplifiers.

A clamping control circuit 202 applies current to node 204 of the differential amplifier 200 through current mirror transistors 206 and 208, e.g., NMOS field effect transistors (FETs). A PMOS differential pair (transistors 210 and 212) may be used to provide this clamping current. For the differential amplifier 200 circuit shown in FIG. 2, the available supply voltage may not allow a standard configuration (common source) for such a differential transistor pair as illustrated in the circuit of FIG. 1. Therefore a common gate configuration may be used. It is contemplated and within the scope of the present invention that an NMOS differential transistor pair with an active current mirror or folded cascode current mirror may also be utilized in embodiments according to the present disclosure.

The clamping principle used in the circuit of FIG. 2 is similar in operation to what was described hereinabove for the circuit of the operational amplifier 100 depicted in FIG. 1. When the output voltage is below VCLAMP, transistor 212 is off and there is no clamping current mirrored at node 204. Therefore the clamping circuit has substantially no effect on the behavior of the operational amplifier 200. When the output voltage raises very close to VCLAMP the transistor 212 of the clamping pair (transistors 210 and 212) starts providing a current that is mirrored into the node 204 and thereby starts taking partial control of the operational amplifier 200. When VOUT is substantially equal to VCLAMP, transistor 212 has substantially full control of the operational amplifier 200 and the output voltage, VOUT, is thereby limited (clamped) to VCLAMP.

The clamping differential transistor pair may be configured as a differentially connected common source transistor pair, e.g., transistors 106 and 108 of FIG. 1, or as a differentially connected common gate transistor pair, e.g., transistors 210 and 212 of FIG. 2. It is contemplated and within the scope of the present disclosure that a resistor may be connected in series with the sources of the clamping transistor pair for a softer clamping action. A separate resistor may be coupled in series between each source of the clamping transistor pair and the current source, e.g., current source 114 (FIG. 1). A separate current source may be coupled to each source of the clamping transistor pair and a resistor may be coupled between the sources of the clamping transistor pair. Other configurations and connections of the softening resistor(s) to the clamping transistor pair may be used for softening the clamping action thereof (e.g., how fast the clamping action occurs).

While embodiments of the present disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of the present disclosure.

The depicted and described embodiments of the present disclosure are examples only, and are not exhaustive of the scope of the disclosure.

What is claimed is:

1. An operational amplifier having output voltage limitation, comprising:
    an operational amplifier having a differential input and an output, the differential input comprising a differentially connected transistor pair;
    a voltage clamp comprising a differentially connected transistor pair, wherein one transistor of the voltage clamp transistor pair is coupled to the differential input transistor pair and the output, and the other transistor of the voltage clamp transistor pair is coupled to a clamp voltage reference, such that when a voltage on the output of the operational amplifier is substantially equal to the clamp voltage reference the voltage clamp controls the output voltage of the operational amplifier; and
    a current mirror supplying current to the differentially connected input transistor pair and the one transistor of the voltage clamp transistor pair, wherein when the one transistor of the voltage clamp differential transistor pair draws substantially the same current as drawn by the differential input transistor pair and the output of the operational amplifier is thereby controlled to be at substantially the clamp voltage reference.

2. The operational amplifier according to claim 1, wherein the differential input transistor pair is coupled in series with a first current source and the voltage clamp transistor pair is coupled in series with a second current source, whereby the second current operates at a higher current then the first current source.

3. The operational amplifier according to claim 2, wherein the second current source is approximately twice the current as the first current source.

4. The operational amplifier according to claim 1, wherein one of a positive voltage clamp differential transistor pair is coupled to a positive clamp voltage reference and one of a negative voltage clamp differential transistor pair is coupled to a negative clamp voltage reference, the other ones of the positive and negative voltage clamp differential transistor pairs are coupled to the differential input transistor pair such that a voltage on the output does not substantially exceed the positive or negative clamp voltage references.

5. The operational amplifier according to claim 1, wherein the voltage clamp transistor pair is differentially connected in a common gate configuration.

6. The operational amplifier according to claim 1, wherein the voltage clamp transistor pair is differentially connected in a common source configuration.

7. The operational amplifier according to claim 1, further comprising a clamp softening resistor coupled to the voltage clamp transistor pair for softening the voltage clamping action of the output of the operational amplifier.

8. The operational amplifier according to claim 1, wherein the voltage clamp transistor pair is stronger then the differential input transistor pair.

9. The operational amplifier according to claim 1, wherein the complementary input differential transistor pairs are used for rail-to-to rail input voltage operation.

10. An operational amplifier having output voltage limitation, comprising:
    first and second transistors configured as a differential input of an operational amplifier;
    a first current source coupled to the first and second transistors;
    a current mirror coupled to the first and second transistors;
    a third transistor adapted as an output stage of the operational amplifier, the third transistor coupled to the current mirror and the second transistor;
    a second current source;
    a fourth transistor coupled to the second current source and a clamp voltage reference; and
    a fifth transistor coupled to the second current source and the current mirror, wherein when a voltage at the output of the operational amplifier is substantially equal to the clamp voltage reference the fifth transistor substantially controls the third transistor so that the output of the operational amplifier does not substantially exceed the clamp voltage reference.

11. The operational amplifier according to claim 10, wherein the first and second transistors control the third transistor when the output of the operational amplifier is less than the clamp voltage reference.

12. The operational amplifier according to claim 10, wherein the second current source has a greater current output than the first current source.

13. The operational amplifier according to claim 12, wherein the second current source has approximately twice the current output as the first current source.

14. The operational amplifier according to claim 10, the fourth and fifth transistors are differentially connected in a common gate configuration.

15. The operational amplifier according to claim 10, wherein the fourth and fifth transistors are differentially connected in a common source configuration.

16. The operational amplifier according to claim 10, further comprising a clamp softening resistor coupled to the fourth and fifth transistors for softening the voltage clamping action of the output of the operational amplifier.

17. The operational amplifier according to claim 10, wherein the fourth and fifth transistors comprise a transistor pair that is stronger than the differential input pair first and second transistors.

18. A method of limiting an output voltage of an operational amplifier, said method comprising the steps of:
    providing a differential input transistor pair in an operational amplifier having an output, wherein the differential input transistor pair controls the output;
    providing a voltage clamp differential transistor pair; and
    coupling one transistor of the voltage clamp differential transistor pair to a clamp voltage reference, and the other transistor of the voltage clamp differential transistor pair to the operational amplifier output such that when the output of the operational amplifier has a voltage substantially equal to the clamp voltage reference, the other transistor of the voltage clamp differential transistor pair controls the output so that the voltage on the output does not exceed the clamp voltage reference,
    wherein when the other transistor of the voltage clamp differential transistor pair controls the output the differential input transistor pair does not control the output.

19. The method according to 18, wherein the step of controlling the output of the differential amplifier transitions from control by the differential input transistor pair to control by the voltage clamp differential transistor pair as the output voltage approaches the clamp voltage reference.

* * * * *